US011165269B2

(12) United States Patent
Yin et al.

(10) Patent No.: US 11,165,269 B2
(45) Date of Patent: Nov. 2, 2021

(54) ELECTRONIC APPARATUS, CHARGING METHOD, AND NON-TRANSITORY COMPUTER READABLE RECORDING MEDIUM

(71) Applicant: ASUSTeK COMPUTER INC., Taipei (TW)

(72) Inventors: Ding-Jun Yin, Taipei (TW); Shao-Yu Wang, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 350 days.

(21) Appl. No.: 16/275,546

(22) Filed: Feb. 14, 2019

(65) Prior Publication Data

US 2019/0267814 A1    Aug. 29, 2019

Related U.S. Application Data

(60) Provisional application No. 62/634,221, filed on Feb. 23, 2018.

(30) Foreign Application Priority Data

Dec. 29, 2018   (CN) .......................... 201811634168.2

(51) Int. Cl.
*H02J 7/00* (2006.01)
*G01R 31/382* (2019.01)

(52) U.S. Cl.
CPC ............ *H02J 7/007* (2013.01); *G01R 31/382* (2019.01); *H02J 7/00712* (2020.01)

(58) Field of Classification Search
CPC ....................................................... H02J 7/007

USPC ........................................................... 320/162
See application file for complete search history.

(56) References Cited

U.S. PATENT DOCUMENTS

| | | | | |
|---|---|---|---|---|
| 2011/0057603 A1* | 3/2011 | Marty | .................. | H02J 7/0069 320/106 |
| 2012/0299554 A1* | 11/2012 | Kruglick | .................. | H02J 7/00 320/160 |
| 2014/0077754 A1* | 3/2014 | Carmichael | .......... | H02J 7/0077 320/107 |
| 2015/0048803 A1* | 2/2015 | Noh | .................... | H02J 7/00036 320/155 |

(Continued)

FOREIGN PATENT DOCUMENTS

| | | |
|---|---|---|
| CN | 105684260 A | 6/2016 |
| CN | 107196363 A | 9/2017 |
| EP | 3066743 B1 | 12/2017 |

*Primary Examiner* — Jerry D Robbins
(74) *Attorney, Agent, or Firm* — McClure, Qualey & Rodack, LLP

(57) ABSTRACT

The disclosure provides an electronic apparatus, a charging method and a non-volatile computer readable recording medium. The electronic apparatus includes a power module and a processor coupled to the power module. The processor is configured to: obtain a charging start time point of the power module; estimate a charging recovery time point according to usage state information; when an electric quantity of the power module is greater than or equal to a first electric quantity, stop the power module from being charged continuously; and at the charging recovery time point, enable the power module to be charged to a second electric quantity, where the second electric quantity is greater than the first electric quantity.

13 Claims, 6 Drawing Sheets

(56) References Cited

U.S. PATENT DOCUMENTS

| | | | |
|---|---|---|---|
| 2015/0188324 A1* | 7/2015 | Nicholson | H02J 7/007188 320/107 |
| 2020/0180465 A1* | 6/2020 | Watson | B60L 53/18 |

* cited by examiner

ELECTRONIC APPARATUS, CHARGING METHOD, AND NON-TRANSITORY COMPUTER READABLE RECORDING MEDIUM

CROSS-REFERENCE TO RELATED APPLICATION

This application claims the priority benefit of U.S. provisional application Ser. No. 62/634,221, filed on Feb. 23, 2018 and Chinese application serial No. 201811634168.2, filed on Dec. 29, 2018. The entirety of the above-mentioned patent applications are hereby incorporated by references herein and made a part of specification.

BACKGROUND OF THE INVENTION

Field of the Invention

The disclosure relates to a charging method.

Description of the Related Art

For the purpose of portability in use, most electronic apparatuses currently on the market are provided with built-in rechargeable batteries to supply power. As the electronic apparatus provides diversified and personalized functions, the electronic apparatus is connected to a power source and charged only when a user does not use the electronic apparatus or it is estimated that the current electric quantity is insufficient for use in a period of time in the future.

A time length that the electronic apparatus connecting the power source affects the battery status. Currently, after being charged to a particular level, the battery is kept charged but with a small amount of power supply. However, when the battery is charged for a period of time, the user may mistakenly believe that the battery is fully charged because a period of time has elapsed even with a small amount of power supply, thereby causing usage inconvenience.

BRIEF SUMMARY OF THE INVENTION

According to the first aspect, an electronic apparatus is provided herein. The electronic apparatus includes a power module and a processor. The processor is coupled to the power module and configured to perform steps of: obtaining a charging start time point of the power module; estimating a resuming charge time point according to usage state information; stopping the power module being charged when an electric quantity of the power module is greater than or equal to a first electric quantity; and resuming charging the power module to a second electric quantity at the resuming charging time point, wherein the second electric quantity is greater than the first electric quantity.

According to the second aspect of the disclosure, a charging method applied to an electronic apparatus with a power module is provided herein. The charging method comprises: obtaining a charging start time point of the power module; estimating a resuming charging time point according to usage state information; stopping the power module being charged when an electric quantity of the power module is greater than or equal to a first electric quantity; and resuming charging the power module to a second electric quantity at the resuming charging time point, wherein the second electric quantity is greater than the first electric quantity. The disclosure further provides a charging method applied to an electronic apparatus having a power module. The charging method includes the following steps: obtaining a charging start time point of the power module; estimating a charging recovery time point according to usage state information; when the power module is charged to a first electric quantity, stopping the power module from being charged continuously; and at the charging recovery time point, enabling the power module to be charged to a second electric quantity, where the second electric quantity is greater than the first electric quantity.

According to the third aspect of the disclosure, a non-transitory computer readable storage medium is provided herein. The non-transitory computer readable storage medium storing multiple pieces of program code, wherein after the program code is loaded into a processor, the processor executes the program code to complete the following steps: obtaining a charging start time point of the power module; estimating a resuming charging time point according to usage state information; stopping the power module being charged when an electric quantity of the power module is greater than or equal to a first electric quantity; and resuming charging the power module being charged to a second electric quantity at the resuming charging time point, wherein the second electric quantity is greater than the first electric quantity.

BRIEF DESCRIPTION OF THE DRAWINGS

The disclosure will be better understood when the following detailed description is read with reference to the accompanying drawings. It should be noted that, features in the drawings are not necessarily drawn to scale according to practical requirements of the description. In fact, the sizes of the features can be increased or decreased randomly for the purpose of clear description.

DETAILED DESCRIPTION OF THE EMBODIMENTS

Figure 1:
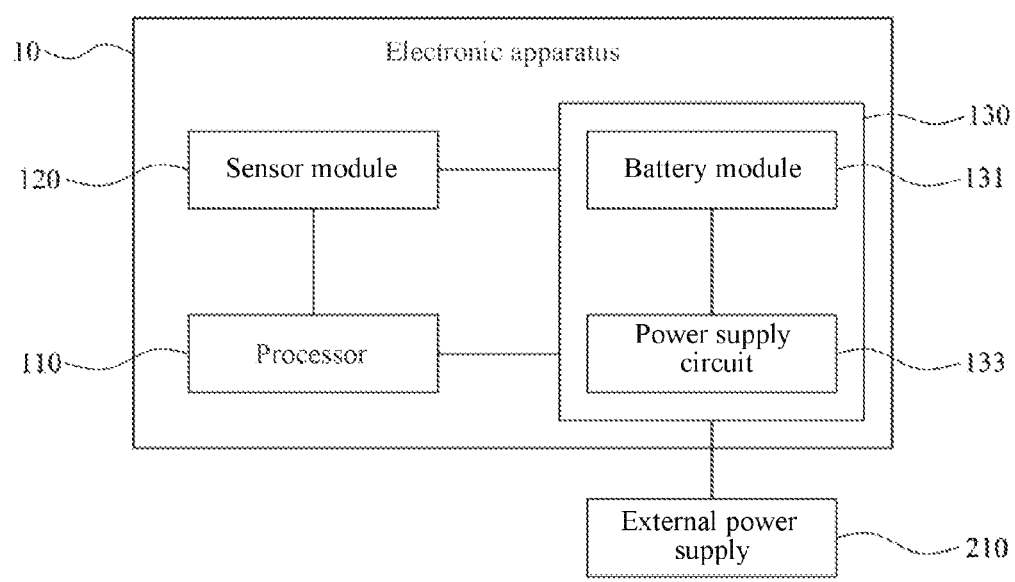
FIG. 1 is a schematic diagram of functional blocks of an electronic apparatus according to some embodiments of the disclosure.

The following disclosure provides many different embodiments or instances to implement different features of the present invention. Elements and arranged particular embodiments are described below to simplify the present invention. Definitely, such instances are merely examples and not intended to limit the present invention. In an example, forming a first feature above or on a second feature in the following description can include an embodiment of forming a first feature and a second feature in direct contact and an embodiment of forming an additional feature between the first feature and the second feature such that the first feature and the second feature are not in direct contact. In addition, reference signs and/or letters can be repeated in the embodiments of the present invention to make the description simple and clear, and the repetition does not imply any relationship between the discussed embodiments and/or configurations.

Further, for ease of description, spatial relativity terms (under, below, lower, above, higher, and the like) can be used in the disclosure to describe the relationship of one element or feature with another element (or other elements) or another feature (or other features) shown in the drawings. In addition to the orientation described in the drawings, the spatial relativity terms are intended to include different orientations of an apparatus being used or operated. A device can be oriented in other manners (rotated by 90 degrees or in other orientations) and the spatial relativity terms used in the disclosure can be interpreted in the same way.

Referring to FIG. 1, an electronic apparatus 10 includes a processor 110, a sensor module 120, a power module 130, and a power supply 210. In one embodiment, the electronic apparatus 10 is a portable electronic apparatus, a mobile phone, a tablet computer, a personal digital assistant (PDA), a wearable apparatus, a notebook computer, or the like.

As shown in FIG. 1, the processor 110 is coupled to the sensor module 120 and the power module 130. The processor 110 is a central processing unit (CPU) or a microprocessor of the electronic apparatus 10.

The power module 130 includes a power supply circuit 133 and a battery module 131. The power supply circuit 133 is coupled to the battery module 131. The power supply circuit 133 is coupled to a power supply device 210 through a charging wire, to provide power obtained from the power supply device 210 to the battery module 131. In an embodiment, the battery module 131 is a lithium battery or another type of rechargeable battery. In some embodiments, the power supply device 210 is supply mains, a computer apparatus, a mobile power source, or the like. The disclosure is not limited thereto.

In an embodiment, the sensor module 120 detects whether the power module 130 is electrically connected with the power supply device 210. In this embodiment, when the power supply circuit 133 of the power module 130 is electrically connected to the power supply device 210, the sensor module 120 detects an input signal of the power supply device 210. In an embodiment, the input signal includes a current signal, a voltage signal, or another similar electric signal.

The sensor module 120 transmits a first signal to the processor 110 when detecting that the power module 130 is electrically connected with the power supply device 210 (that is, the power supply circuit 133 is electrically connected to the power supply device 210) or the power module 130 is charged. The processor 110 accesses a charging start time point (that is, time information when charging is started) of the electronic apparatus 10 according to the first signal. In this embodiment, the electronic apparatus 10 accesses a current electric quantity of the battery module 131 by the processor 110. In some other embodiments, the electronic apparatus 10 access the current electric quantity of the battery module 131 by, an electric quantity sensing circuit (not shown).

During continuous charging, the power supply 210 continuously supplies power to the battery module 131 through the power supply circuit 133, until the power module 130 is disconnected from the power supply 210. When detecting that the power module 130 is not connected with the power supply 210 or the power module 130 is interrupted charging, the sensor module 120 transmits a second signal to the processor 110. The processor 110 accesses a charging end time point (that is, time information when charging is ended) of the electronic apparatus 10 according to the second signal. In an embodiment, the processor 110 also accesses a current electric quantity reading of the battery module 131 according to the second signal. In an example, the current electric quantity reading is battery level percentage information. In an embodiment, the charging start time point and the charging end time point are at least one of date information, clock information or other similar information representing a date time.

The processor 110 records the charging start time point, the current electric quantity reading, and the charging end time point as usage state information. In an embodiment, the usage state information is at least one of, but not limited to, a charging start time point that the current connection between the power supply circuit 133 and the power supply 210 is established, a disconnection time point when the power supply circuit 133 is disconnected from the power supply 210, or a current electric quantity reading of the battery module 131 at the disconnection time point. Therefore, usage state information which is generated by executing a complete charging program of the power module 130 is recorded to establish a charging behavior database. In an embodiment, the complete charging program refers to a process from a time point that the power module 130 is connected to the power supply 210 to a time point that the electrical connection between the power module 130 and the power supply 210 is interrupted.

Figure 2:
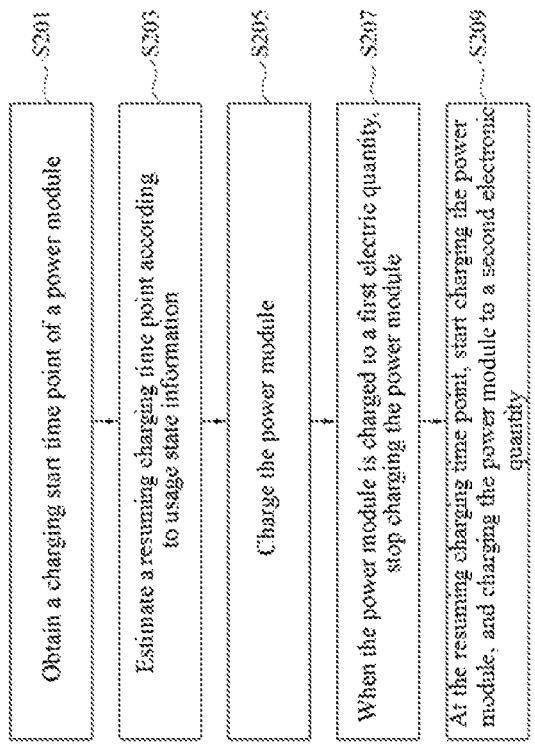
FIG. 2 is a schematic flowchart of an intelligent charging mode in a charging method according to an embodiment of the disclosure.

Referring to FIG. 1 and FIG. 2, when the sensor module 120 detects that the power module 130 is connected to the power supply 210, in step S201, the sensor module 120 transmits a first signal to the processor 110. The processor 110 accesses a charging start time point that charging for the power module 130 is started according to the first signal. Next, step S203 is performed, in which the processor 110 estimates a resuming charging time point according to usage state information. In an embodiment, if the electronic apparatus 10 never be charged, it is impossible to estimate a resuming charging time point according to usage state information. In this case, the processor 110 estimates the resuming charging time point according to a pre-established algorithm or normal charging rule information (for example, a daily routine or a charging habit of a common user).

In step S205, while the power supply 210 supplies power to the battery module 131 continuously through the power supply circuit 133, the processor 110 continuously monitors an electric quantity of the battery module 131. As shown in step S207, when the battery module 131 is charged to a first electric quantity, the processor 110 controls the power supply circuit 133 to stop supplying power received from the power supply 210 to the battery module 131 (that is, the power supply circuit 133 stops charging the battery module 131). The processor 110 also accesses a charging stop time point and records the charging stop time point into the usage state information. In an embodiment, the charging stop time point includes at least one of a calendar date or a clock time. The power supply circuit 133 does not supply power to the battery module 131 within a period from the charging stop time point to the resuming charging time point.

In step S209, at the resuming charging time point, the processor 110 controls the power supply circuit 133 to resume charging the battery module 131. Next, the battery module 131 is continuously charged from the first electric quantity to a second electric quantity, wherein the second electric quantity is greater than the first electric quantity. In an example, the first electric quantity is 80% of battery capacity, and the second electric quantity is 100% of battery capacity. The disclosure does not limit the expression of the electric quantity, and any form capable of representing a battery level falls within the implementation scope of the disclosure.

The processor 110 estimates the resuming charging time point according to the recorded usage state information. In an embodiment, after obtaining the charging start time point, the processor 110 substitutes the usage state information into an algorithm to estimate a charging end time point. The charging end time point refers to an estimated end time point of the complete charging program. In an embodiment, the charging end time point refers to at least one of a time point that the electronic apparatus 10 is disconnected from the power supply 210 or a time point that the battery module 131 is fully charged.

In an embodiment, the processor 110 groups a plurality of high-correlated charging start time points into the same group by a mathematical statistics method, and each group has a corresponding charging start time point and an end time point. Next, after analyzing the current charging start time point belongs to which group by an algorithm, an end time point corresponding to the group which the current charging start time point belongs to is used as the charging end time point of the current charging program. In an embodiment, the algorithm is at least one of, but not limited to, a K means algorithm, a linear regression algorithm, a neural network learning algorithm, or other similar algorithms.

Further, the processor 110 traces back for a period of time from the estimated charging end time point, to obtain a resuming charging time point. In an embodiment, processor 110 subtracts a recharging time length from the charging end time point to obtain the resuming charging time point. In an embodiment, the recharging time length refers to a time length required for charging the battery module 131 from the first electric quantity to the second electric quantity or a preset time length (such as one hour). That is, when the battery module 131 is charged to the first electric quantity, charging is stopped until the charging recovery time point. At the charging recovery time point, the processor 110 controls the power supply circuit 133 to resume charging the battery module 131. The charging method of the disclosure prevents the damage of the power module 130 is caused by supplying long-time continuous high-current power to the battery module 131 of the power module 130. In addition, estimating a charging resuming time point according to a daily routine and a charging habit of a user can avoid the situation that the user is in need of the electronic apparatus 10 urgently but the electronic apparatus 10 is not fully charged.

Figure 3A:
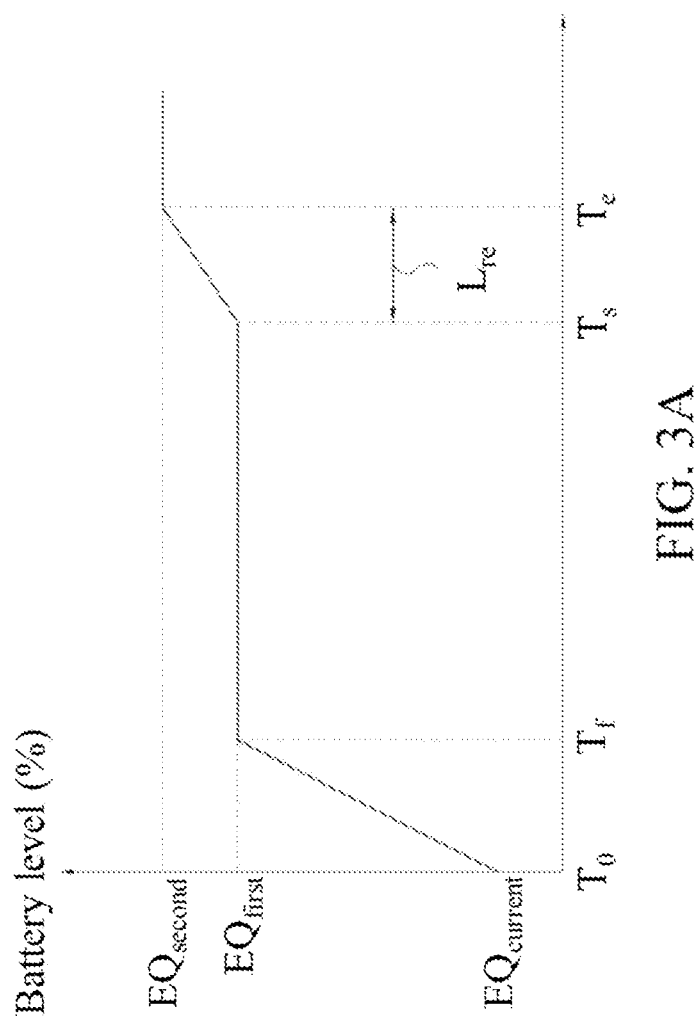
FIG. 3A and FIG. 3B are schematic diagrams of time vs. electric quantity in an intelligent charging mode in a charging method according to an embodiment of the disclosure.

Referring to FIG. 1 and FIG. 3A together, in an embodiment, when the power module 130 is connected to the power supply 210 (that is, at a charging start time point $T_0$), the processor 110 accesses a current electric quantity $EQ_{current}$, such as 15%, of the battery module 131.

Next, the processor 110 determines whether the current electric quantity of the battery module 131 is less than a first electric quantity $EQ_{first}$ (such as 80%), so as to determine whether to execute a first-stage charging on the battery module 131. In an embodiment, when the processor 110 determines that the current electric quantity $EQ_{current}$ of the battery module 131 is less than the first electric quantity $EQ_{first}$, the processor 110 controls the power supply circuit 133 to start charging the battery module 131 (that is, the power supply circuit 133 supplies power obtained from the power supply 210 to the battery module 131), so that the battery module 131 is charged from the current electric quantity $EQ_{current}$ to the first electric quantity $EQ_{first}$.

As shown in FIG. 3A, a time point of the first electric quantity $EQ_{first}$ is corresponding to a charging stop time point $T_f$. Therefore, at the charging stop time point $T_f$, the power supply circuit 133 stops charging the battery module 131 (that is, the power supply circuit 133 stops supplying power obtained from the power supply 210 to the battery module 131). In an embodiment, in a time range from the charging stop time point $T_f$ to a charging recovery time point $T_s$, the power supply circuit 133 does not charge the battery module 131. A method for obtaining the resuming charging time point $T_s$ is the same as that described above, and is not described herein again. It should be noted that, in the schematic diagram of time vs. electric quantity of the disclosure, the time axis represents Greenwich Mean Time and date or a relative time, and any form capable of representing an absolute relationship or relative relationship of time falls within the scope of the disclosure.

At the resuming charging time point $T_s$, the power supply circuit 133 starts to execute a second-stage charging on the battery module 131. After the power supply circuit 133 is continuously charged for a recharging time length $L_{re}$, the electric quantity increases from the first electric quantity to the second electric quantity. In an embodiment, the recharging time length $L_{re}$ is one hour or a time length close to one hour. In an embodiment, the electric quantity of the power module 130 increase from the first electric quantity $EQ_{first}$ to the second electric quantity $EQ_{second}$ in the recharging time length $L_{re}$.

Figure 3B:
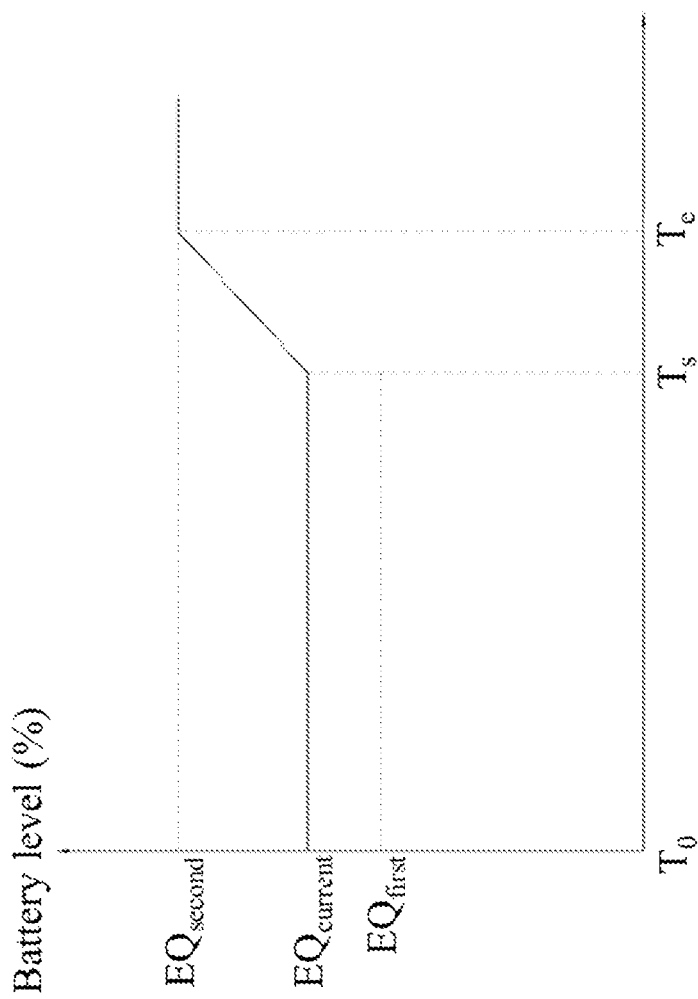

Referring to FIG. 3B, the processor 110 determines whether a current electric quantity of the power module 130 is less than the first electric quantity $EQ_{first}$ (such as 80%), so as to determine whether execute the first-stage charging on the battery module 131. In an embodiment, the processor 110 accesses a current electric quantity $EQ_{current}$ of the battery module 131. Using the current electric quantity $EQ_{current}$ being 85% as an example, because the current electric quantity $EQ_{current}$ of the battery module 131 is greater than the first electric quantity $EQ_{first}$, the processor 110 controls the power supply circuit 133 not to execute the first-stage charging on the battery module 131 until the resuming charging time point $T_s$. At the resuming charging time point $T_s$, the processor 110 controls the power supply circuit 133 to execute the second-stage charging on the battery module 131. After the second-stage charging is finished, the electric quantity of the power supply circuit 133 increases from the first electric quantity $EQ_{first}$ to the second electric quantity $EQ_{second}$.

In the charging method of the disclosure, the related data of each time the complete charging program for the power module 130 (in an example, the complete charging program is from a time point that the charging for the power module 130 is started to a time point that the power module 130 is fully charged), so as to analyze and estimate at least one of a charging recovery time point, a charging end time point, and a time point when the power module 130 is disconnected from the power supply 210. is recorded and collected. In an embodiment, the related data includes at least one of a time point that the electronic apparatus 10 is connected to the power supply 210 or a time point that a user uses a mobile phone) As such, the charging method of the disclosure prevents the power module 130 is always in a high-voltage high-current state, so as to extend the service life of the power module 130. The resuming charging time point is also estimated accurately, so that the the battery module 131 is in a fully-charged state when the power module 130 is disconnected from the power supply 210.

Figure 4:
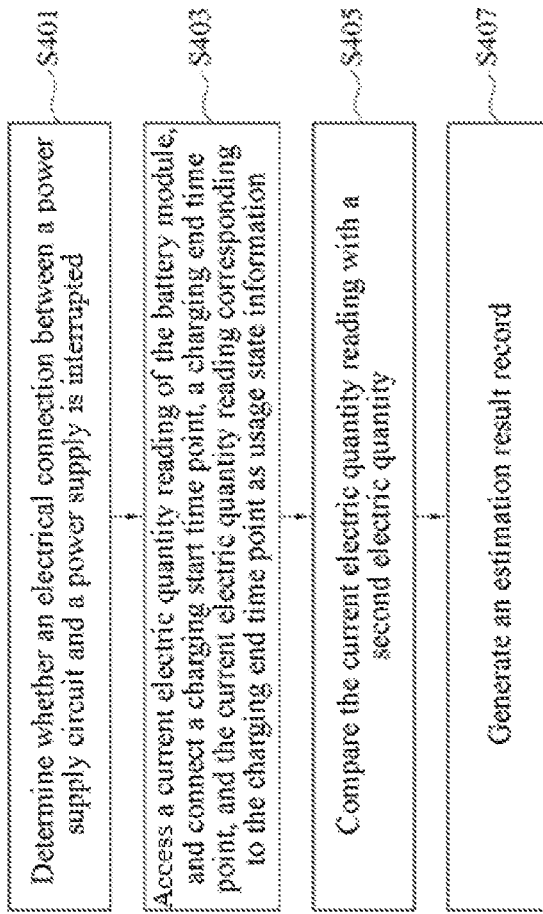
FIG. 4 is a further schematic flowchart about a charging method according to an embodiment of the disclosure.

Referring to FIG. 4, in the charging method of the disclosure, the usage state information is recorded after the power module 130 is disconnected from the power supply 210, and intelligent learning is executed according to the usage state information. Referring to FIG. 1 and FIG. 4 together, in step S401, the processor 110 determines whether the electrical connection between the power supply circuit 133 and the power supply 210 is interrupted. Generally, when a user thinks the charging of the electronic apparatus 10 is finished or the user needs to use the electronic apparatus 10, the user disconnects the electronic apparatus 10 from the power supply 210. When it is determined that the electrical connection between the power supply circuit 133 and the power supply 210 has been interrupted, step S403 is performed.

In step S403, the processor 110 accesses a current electric quantity reading of the battery module 131, and collects a charging start time point, a charging end time point, and the current electric quantity reading corresponding to the charging end time point as usage state information. In an embodiment, the current electric quantity reading is 100% of battery capacity. In another embodiment, the current electric quantity reading is 98% of battery capacity. The current electric quantity reading is affected by a time point when the power supply circuit 133 is disconnected from the power supply 210. In an embodiment, the power supply circuit 133 is connected to the power supply 210 at 11 PM on May $1^{st}$, and the processor 110 estimates that 8 AM on May $2^{nd}$ is the charging end time point according to the usage state information, and subtracts a recharging time length from the charging end time point to obtain the resuming charging time point is 7 AM on May $2^{nd}$. In this embodiment, the user disconnects the electronic apparatus 10 from the power supply 210 at 8 AM on May $2^{nd}$. Therefore, the current electric quantity reading of the battery module 131 is 100% at 8 AM on May $2^{nd}$. To learn a charging habit of the user, the sensor module 120 collects the charging start time point, the charging end time point, and the current electric quantity reading corresponding to the charging end time point in each complete charging program as usage state information. In this embodiment, the charging start time point is 11 PM on May $1^{st}$, the charging end time point is 8 AM on May $2^{nd}$, and the current electric quantity reading corresponding to the charging end time point is 100%.

After the processor 110 accesses the current electric quantity reading corresponding to the charging end time point of the battery module 131, in step S405, the processor 110 determines whether the current electric quantity reading meets a second electric quantity. In an embodiment, when the second electric quantity is set to 100%, if the read current electric quantity reading is 100%, it is determined that the current electric quantity reading meets the second electric quantity. If the current electric quantity reading meets the second electric quantity, a charging estimation result is marked as "accomplished" (that is, at the charging end time point, the battery module 131 is fully charged). Next, step S407 is performed, in which the processor 110 generates an estimation result record according to the charging estimation result.

Figure 5:
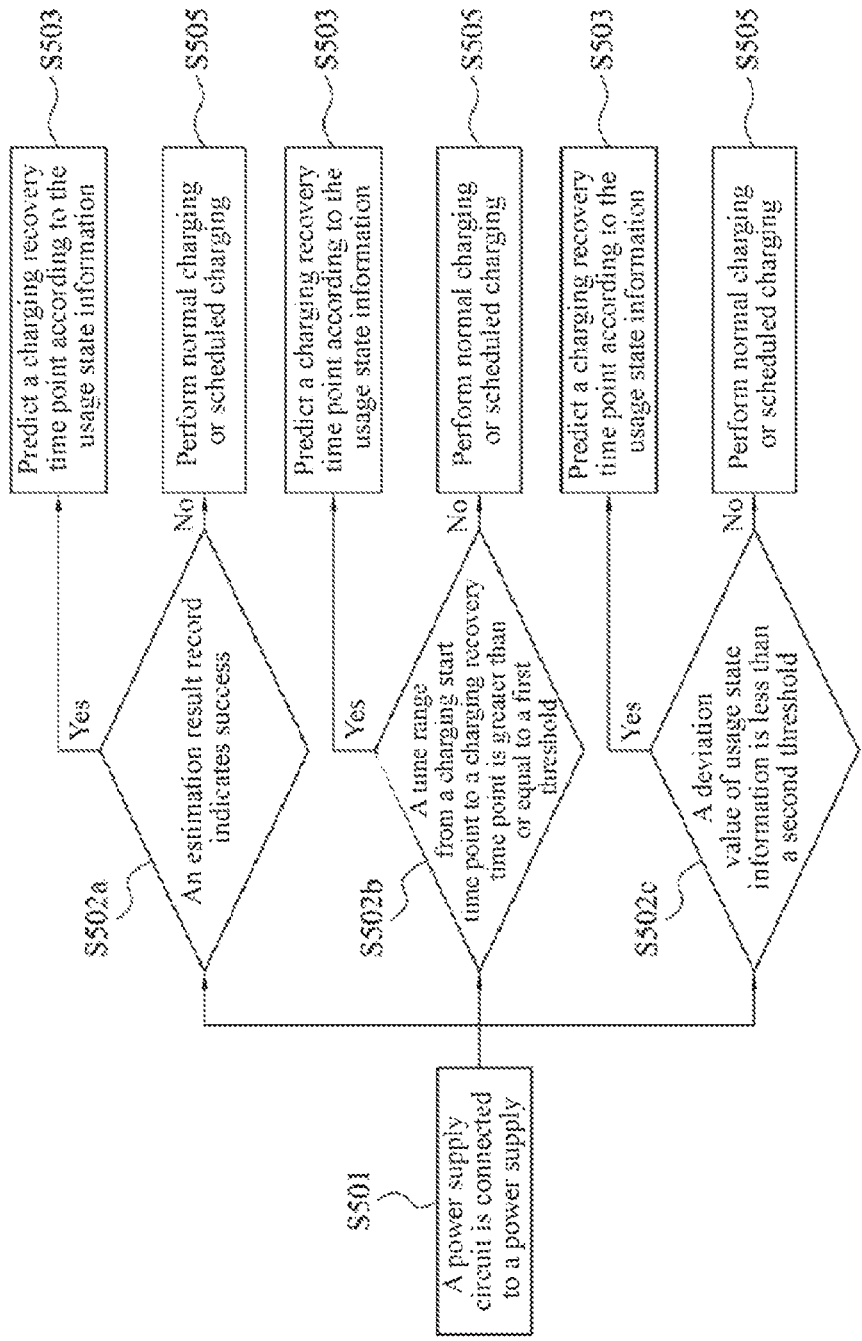
FIG. 5 is a further schematic flowchart about determining of a charging mode in a charging method according to an embodiment of the disclosure.

In an embodiment, the estimation result record is a weighted score of an accumulated quantity of charging estimation results marked as "accomplished" or "not accomplished". In an embodiment, when the charging estimation results at the same period of time in three consecutive days are: accomplished, accomplished, accomplished, and weights of the consecutive "accomplished" are 0.6, 0.8, 1.2, an operation result generated by using a charging estimation expression (0.6+0.8+1.2)/3 is approximately 0.86. In an embodiment, when the operation result (such as 0.86) is greater than or equal to a specified value (such as 0.8), the estimation result record is marked as "successful". When the operation result (such as 0.6) is greater than or equal to the specified value (such as 0.8), the estimation result record is marked as "failed". Therefore, it is learned from the estimation result record whether the usage state information is with high reliability or low reliability. The weighted calculation method above is merely an example for description, and the disclosure is not limited thereto. Therefore, when the electronic apparatus 10 is charged again, the processor 110 evaluates whether to use the foregoing intelligent charging mode according to the estimation result record. If the estimation result record of the charging period is "successful", the foregoing intelligent charging mode is used. Referring to FIG. 1, FIG. 3A and FIG. 5, the following describes steps for selecting a normal charging mode, a scheduled charging mode, and the foregoing intelligent charging mode. In an embodiment, the normal charging mode means that in a complete charging program, the power supply circuit 133 continuously charges the battery module 131 starting from a time point that the power module 130 is connected to the power supply 210 to a time point that the power module 130 is disconnected from the power supply 210 or the battery module 131 is fully charged. In an embodiment, the scheduled charging mode means that in a complete charging program, the power supply circuit 133 starts to charge the battery module 131 from a time point that the power module 130 is connected to the power supply 210 to a time point that the electric quantity of the battery module 131 reaches a particular electric quantity, and stops charging the battery module 131 until a scheduled fixed time point. At the scheduled fixed time point, the power supply circuit 133 resumes charging the battery module 131.

As shown in FIG. 5, when the power supply circuit 133 is connected to the power supply 210, the processor 110 obtains a charging start time point (step S501). Details of this step are similar to those of step S201 above. In step S502a, the processor 110 determines whether the current complete charging program is successful according to an estimation result record. In an example, if the estimation result record is "failed" (for example, an estimation result is less than the specified value 0.8), it indicates that the accuracy of a resuming charging time point $T_s$ calculated based on a charging end time point $T_e$ estimated according to the current usage state information is not desirable (for example, the battery module 131 cannot be charged to 100%). Therefore, when the estimation result record is "failed", the processor 110 chooses to perform the normal charging mode or the scheduled charging mode (step S505), rather than the foregoing intelligent charging mode shown in FIG. 2 to FIG. 3B. In another embodiment, if the estimation result record is "successful", it indicates that the foregoing intelligent charging mode shown in FIG. 2 to FIG. 3B is performed, so as to estimate a resuming charging time point according to the usage state information. In this case, the processor 110 performs S503. In step S503, steps S203 to S209 in FIG. 2 are performed.

In another embodiment, the charging method further includes determining whether there is a requirement for stopping charging. After the processor 110 obtains the charging start time point (step S501), step S502b is performed, in which the processor 110 determines whether a time range from the charging start time point to the resuming charging time point $T_s$ is not less than a first threshold (such as three hours). If the time range from the charging start time point to the resuming charging time point $T_s$ is less than the first threshold, the processor 110 performs the normal charging mode or the scheduled charging mode, rather than the foregoing intelligent charging mode shown in FIG. 2 to FIG. 3B. In an embodiment, the first threshold is adjusted according to an actual situation to provide a charging method as required more flexibly. On the other hand, if the time range from the charging start time point to the charging recovery time point $T_s$ is not less than (that is, greater than or equal to) the first threshold, it indicates that the foregoing intelligent charging mode shown in FIG. 2 to FIG. 3B is performed, so as to estimate a resuming charging time point according to the usage state information. In this case, the processor 110 performs S503. In step S503, steps S203 to S209 in FIG. 2 are performed.

In another embodiment, the charging method further includes determining whether usage state information is credible by a mathematical statistics method. After the processor 110 obtains the charging start time point (step S501), step S502c is performed, in which the processor 110 determines whether a deviation value of the usage state information is less than a second threshold (such as 1). If the deviation value is not less than the second threshold, the processor 110 performs the normal charging mode or the scheduled charging mode (that is, step S505 is performed), rather than the foregoing intelligent charging mode shown in FIG. 2 to FIG. 3B. In an embodiment, the deviation value is a standard deviation. When the deviation value of the usage state information is less than the second threshold, it indicates that the foregoing intelligent charging mode shown in FIG. 2 to FIG. 3B is performed, so as to estimate a resuming charging time point according to the usage state information. In this case, the processor 110 performs S503. In step S503, steps S203 to S209 in FIG. 2 are performed.

In some embodiments, steps S502a to S502c shown in FIG. 5 are conditions for determining which charging mode (the normal charging mode, the scheduled charging mode or the intelligent charging mode) to be used. A charging mode to be used is determined with reference to determining results based on the three determining conditions in steps S502a to S502c. In an embodiment, step S503 is performed only when the determining results of steps S502a to S502c are all "yes". Step S505 is performed when the determining result of at least one of steps S502a to S502c is "no". In some other embodiments, other combinations of the three judgment conditions are used. In an example, step S503 is performed when two judgment results are "yes"; otherwise, step S505 is performed.

In summary, the disclosure provides an electronic apparatus and a charging method that can be used to analyze and learn a charging habit of a user according to historical usage state information, thereby estimating an accurate charging end time point, so that charging is stopped without affecting a charging effect, and a rechargeable battery is protected in the charging process.

Features of a plurality of embodiments are summarized above, so that a person skilled in the art can better understand the form of the present invention. A person skilled in the art should understand that other procedures and structures can be designed or modified based on the present invention easily, so as to achieve the same purpose and/or the same advantage as the embodiments described in the disclosure. A person skilled in the art should also appreciated that such equivalent structures do not depart from the spirit and scope of the present invention, and various changes, replacements, and modifications of the disclosure can be generated without departing from the spirit and scope of the present invention.

What is claimed is:

1. An electronic apparatus, comprising:
   a power module; and
   a processor, coupled to the power module and configured to perform steps of:
   obtaining a charging start time point of the power module;
   estimating a resuming charge time point according to usage state information;
   stopping the power module being charged when an electric quantity of the power module is greater than or equal to a first electric quantity; and
   resuming charging the power module to a second electric quantity at the resuming charging time point, wherein the second electric quantity is greater than the first electric quantity;
   wherein the power module comprises a battery module and a power supply circuit, the battery module is coupled to the power supply circuit, and when a deviation value of the usage state information is less than a threshold and the battery module is charged to the first electric quantity by the power supply circuit, the power supply circuit stops charging the battery module.

2. The electronic apparatus according to claim 1, wherein the processor is further configured to perform steps of:
   estimating a recharging time length required for charging the power module from the first electric quantity to the second electric quantity; and
   calculating the resuming charging time point according to a charging end time point and the recharging time length.

3. The electronic apparatus according to claim 2, further comprising a sensor module coupled to the processor, wherein when detecting that the power module is electrically connected with a power supply device, the sensor module sends a first signal to the processor, so that the processor accesses the charging start time point according to the first signal, and when detecting that the power module is not electrically connected with the power supply device, the sensor module sends a second signal to the processor, so that the processor accesses the charging end time point according to the second signal.

4. The electronic apparatus according to claim 3, wherein the processor accesses a current electric quantity reading of the power module according to the second signal; and the processor determines whether the current electric quantity reading meets the second electric quantity, so as to generate an estimation result record.

5. The electronic apparatus according to claim 4, wherein when the estimation result record is "successful" and the power supply circuit charges the battery module to the first electric quantity, the power supply circuit stops charging the battery module.

6. The electronic apparatus according to claim 1, wherein when a time interval from the charging start time point to the resuming charging time point is greater than or equal to a time threshold and the battery module is charged to the first electric quantity by the power supply circuit, the power supply circuit stops charging the battery module.

7. A charging method, applied to an electronic apparatus having a power module, comprising:
   obtaining a charging start time point of the power module;
   estimating a resuming charging time point according to usage state information;

stopping the power module being charged when an electric quantity of the power module is greater than or equal to a first electric quantity; and resuming charging the power module to a second electric quantity at the resuming charging time point, wherein the second electric quantity is greater than the first electric quantity;

wherein the power module comprises a battery module and a power supply circuit, and when a time interval from the charging start time point to the resuming charging time point is greater than or equal to a time threshold and the battery module is charged to the first electric quantity by the power supply circuit, the power supply circuit stops charging the battery module.

8. The charging method according to claim 7, further comprising:

estimating a recharging time length required for charging the power module from the first electric quantity to the second electric quantity; and calculating the resuming charging time point according to a charging end time point and the recharging time length.

9. The charging method according to claim 8, further comprising:

sending a first signal to the processor by a sensor module when the power module is charged;

accessing the charging start time point according to the first signal by the processor; and sending a second signal to the processor when the sensor module detects that charging the power module is stopped, so that the charging end time point is accessed according to the second signal by the processor.

10. The charging method according to claim 9, further comprising:

accessing a current electric quantity reading of the power module according to the second signal; and determining whether the current electric quantity reading meets the second electric quantity, so as to generate an estimation result record.

11. The charging method according to claim 10, wherein when the estimation result record is "successful" and the power supply circuit charges the battery module to the first electric quantity, the power supply circuit stops charging the battery module.

12. The charging method according to claim 7, wherein when a deviation value of the usage state information is less than a threshold and the battery module is charged to the first electric quantity by the power supply circuit, the power supply circuit stops charging the battery module.

13. A non-transitory computer readable storage medium, storing multiple pieces of program code and applied to an electronic apparatus having a power module, wherein after the program code is loaded into a processor, the processor executes the program code to complete the following steps:

obtaining a charging start time point of the power module;

estimating a resuming charging time point according to usage state information;

stopping the power module being charged when an electric quantity of the power module is greater than or equal to a first electric quantity; and resuming charging the power module being charged to a second electric quantity at the resuming charging time point, wherein the second electric quantity is greater than the first electric quantity;

wherein the power module comprises a battery module and a power supply circuit, the battery module is coupled to the power supply circuit, and when a deviation value of the usage state information is less than a threshold and the battery module is charged to the first electric quantity by the power supply circuit, the power supply circuit stops charging the battery module.

* * * * *